United States Patent
Zhang et al.

(10) Patent No.: US 11,042,087 B2
(45) Date of Patent: Jun. 22, 2021

(54) DIGITAL PHOTOLITHOGRAPHY METHOD FOR FIBER OPTIC DEVICE BASED ON DIGITAL MICROMIRROR DEVICE COMBINATION

(71) Applicant: NANCHANG HANGKONG UNIVERSITY, Nanchang (CN)

(72) Inventors: Zhimin Zhang, Nanchang (CN); Ningning Luo, Nanchang (CN); Luming Wang, Nanchang (CN)

(73) Assignee: NANCHANG HANGKONG UNIVERSITY, Nanchang (CN)

( * ) Notice: Subject to any disclaimer, the term of this patent is extended or adjusted under 35 U.S.C. 154(b) by 0 days.

(21) Appl. No.: 16/856,077

(22) Filed: Apr. 23, 2020

(65) Prior Publication Data

US 2020/0348590 A1     Nov. 5, 2020

(30) Foreign Application Priority Data

May 3, 2019   (CN) .......................... 201910377307.6

(51) Int. Cl.
*G03F 7/00* (2006.01)
*G03F 7/20* (2006.01)
*G02B 26/08* (2006.01)

(52) U.S. Cl.
CPC ....... *G03F 7/0005* (2013.01); *G02B 26/0833* (2013.01); *G03F 7/70641* (2013.01)

(58) Field of Classification Search
CPC ............ G03F 7/70005; G03F 7/70641; G02B 26/0833
USPC ........................................................ 355/77
See application file for complete search history.

(56) References Cited

U.S. PATENT DOCUMENTS

2017/0010456 A1*   1/2017   Gopinath ................. G02B 3/14
2020/0007838 A1*   1/2020   Stafford ............. G02B 27/4205

\* cited by examiner

*Primary Examiner* — Hung Nguyen
(74) *Attorney, Agent, or Firm* — Hoffmann & Baron, LLP

(57) ABSTRACT

The present invention discloses a digital photolithography method for a fiber optic device (FOD) based on a DMD combination. In this method, reflected light modulated by two DMDs is simultaneously projected onto a same position on an optical fiber end surface through one reduction projection lens. The two DMDs form a primary and secondary digital mask for joint control of an exposure dose distribution formed when patterns are shrunk and projected onto the optical fiber end surface. After the optical fiber end surface coated with photoresist is subject to this dose of exposure, developing, fixing, and etching are conducted, to form a micro-optic device on the optical fiber end surface. In the present invention, distribution of the exposure dose jointly modulated by a digital mask combination formed by the primary and secondary DMD exceeds an order of modulation of an exposure dose by a single DMD.

10 Claims, 2 Drawing Sheets

*FIG. 1*

ALLOW REFLECTED LIGHT MODULATED BY TWO DMDs TO BE SIMULTANEOUSLY PROJECTED ONTO A SAME POSITION ON AN OPTICAL FIBER END SURFACE THROUGH ONE REDUCTION PROJECTION LENS, WHERE THE TWO DMDs RESPECTIVELY GENERATE A PRIMARY AND SECONDARY DIGITAL MASK — S1

CONFIGURE THREE LED LIGHT SOURCES FOR EACH DMD, WHERE THE THREE LED LIGHT SOURCES CAN BE SUCCESSIVELY ROTATED INTO AN OPTICAL PATH ACCORDING TO A REQUIREMENT TO PROVIDE LIGHT SOURCES FOR CORRESPONDING DMDs — S2

CONDUCT FOCUSING, WHERE THE DMD CORRESPONDING TO THE PRIMARY DIGITAL MASK IS MATCHED WITH THE RED LED LIGHT SOURCE, AND THE DMD CORRESPONDING TO THE SECONDARY DIGITAL MASK IS MATCHED WITH THE GREEN LED LIGHT SOURCE; AND MONITOR PATTERNS FORMED ON AN OPTICAL FIBER END SURFACE IN REAL TIME BY USING A MICROSCOPE, TO GUIDE A CONTROL SYSTEM TO ADJUST A POSITION OF THE OPTICAL FIBER — S3

SHRINK PATTERNS OF THE PRIMARY AND SECONDARY DIGITIAL MASK, AND ALLOW SHRUNK PATTERNS TO BE PROJECTED ONTO THE OPTICAL FIBER END SURFACE COATED WITH PHOTORESIST FOR EXPOSURE; AND CONDUCT DEVELOPING, FIXING, POSTBAKING, AND OTHER PROCESSES TO FINALLY FORM A MICROSTRUCTURE ON THE PHOTORESIST ON THE OPTICAL FIBER END SURFACE — S4

CONDUCT WET ETCHING ON THE MICROSTRUCTURE OBTAINED IN THE FOREGOING STEP TO FORM A MICROSTRUCTURE DEVICE ON THE OPTICAL FIBER END SURFACE — S5

DIGITAL PHOTOLITHOGRAPHY METHOD FOR FIBER OPTIC DEVICE BASED ON DIGITAL MICROMIRROR DEVICE COMBINATION

CROSS-REFERENCE TO RELATED APPLICATIONS

This application claims priority to Chinese Patent Application No. 201910377307.6, filed on May 3, 2019, the disclosure of which is incorporated by reference herein in its entirety for all purposes.

TECHNICAL FIELD

The present invention relates to the field of digital photolithography technologies for fiber optic devices (FOD), and particularly to a digital photolithography method for a FOD based on a digital micromirror device (DMD) combination. The present invention further relates to a related system.

BACKGROUND

Optical fibers have drawn great attention as the cornerstone of information superhighways. A FOD or a microfiber optic system formed by fabricating a microstructure on an optical fiber end surface has unique advantages such as high sensitivity, small size, strong anti-electromagnetic interference capability, and easy integration. Therefore, these devices have shown wider applications in medical devices, life sciences, communication, the electronic industry, etc.

In recent years, processing and manufacturing technologies for FODs have become a research hotspot all over the world. Existing micromachining technologies for FODs at home and abroad have such shortcomings as high equipment and fabrication costs, long fabrication cycle, and complex process control, hindering the industrial development. Low efficiency and high costs of the processing technologies have become a bottleneck that restricts the mass industrial production of FODs and even the development of the information industry. Therefore, it is an urgent need to develop a micromachining technology for FODs with a short cycle, low costs, and high precision. In this case, on the basis of spatial light modulator (SLM)-based digital photolithography, the present invention proposes a digital photolithography method for a FOD based on a combination of a primary and secondary DMD. This can provide a new technical approach for the industrial processing of FODs.

SUMMARY

An objective of the present invention is to provide a digital photolithography method for a FOD, to resolve the problems in the existing micromachining technologies for FODs, such as high equipment and fabrication costs, long cycle, and complex process control. In this method, two DMDs are used to form a primary and secondary digital mask for joint control of an exposure dose distribution formed when patterns are shrunk and projected onto an optical fiber end surface; after the optical fiber end surface coated with photoresist is subject to this dose of exposure, developing, fixing, and etching are conducted to form a micro-optic device on the optical fiber end surface.

To achieve the foregoing objective, an embodiment of the present invention provides a digital photolithography method for a FOD based on a DMD combination, the method including: (i) allowing reflected light modulated by two DMDs to be simultaneously projected onto a same position on an optical fiber end surface through one reduction projection lens, where the two DMDs respectively generate a primary and secondary digital mask; (ii) configuring three light-emitting diode (LED) light sources for each DMD, where the three LED light sources are an ultraviolet LED, a red LED, and a green LED, and adapted to be successively rotated into an optical path to provide light sources for corresponding DMDs; (iii) conducting focusing before exposure fabrication, where during focusing, the DMD corresponding to the primary digital mask is matched with the red LED light source, the DMD corresponding to the secondary digital mask is matched with the green LED light source, and monitoring patterns formed on the optical fiber end surface in real time by using a microscope, to guide a control system to adjust a position of the optical fiber; (iv) shrinking patterns of the primary and secondary digital mask, and allowing shrunk patterns to be projected onto the optical fiber end surface coated with photoresist for exposure, and conducting at least one of developing, fixing and postbaking processes to form a microstructure on the photoresist on the optical fiber end surface; and (v) conducting wet etching on the microstructure to form a microstructure device on the optical fiber end surface.

Optionally, in the digital photolithography method for a FOD based on a DMD combination, the primary digital mask in step (i) is used to form a small curvature structure through exposure, and the secondary digital mask is specifically used for optimized fabrication of a large curvature structure through exposure.

Optionally, in the digital photolithography method for a FOD based on a DMD combination, the DMDs corresponding to the primary and secondary digital masks have identical structures, and no primary or secondary DMD is defined.

Optionally, in the digital photolithography method for a FOD based on a DMD combination, there is a one-to-one correspondence between spatial positions, on the optical fiber end surface, of various pixels of the patterns modulated by the two DMDs.

Optionally, in the digital photolithography method for a FOD based on a DMD combination, the photoresist in step (iv) includes positive photoresist or negative photoresist that can be used for photolithography fabrication.

Optionally, in the digital photolithography method for a FOD based on a DMD combination, the wet etching in step (v) is replaced by dry etching.

In accordance with another embodiment of the present invention, a digital photolithography system is provided for a micro-optic device on an optical fiber end surface, applied to the foregoing digital photolithography method for a FOD based on a DMD combination, and includes: an optical fiber and an optical fiber support for holding the optical fiber; a first LED light source and a second LED light source for emitting light; a first DMD and a second DMD for modulating light; a first collimating lens and a second collimating lens for collimating light beams; a total reflection mirror for reflecting light; a first beam splitter and a second beam splitter for splitting light into two light beams; a reduction projection lens for projecting a pattern; a microscope for monitoring an exposure pattern on an optical fiber end surface in real time; and an attenuator for absorbing light that is not used for exposure.

Optionally, in the digital photolithography system for a micro-optic device on an optical fiber end surface, the optical fiber support is fastened to a three-dimensional displacement platform.

Optionally, in the digital photolithography system for a micro-optic device on an optical fiber end surface, the first LED light source and the second LED light source are of a same structure, and both include an ultraviolet LED, a red LED, and a green LED.

Optionally, in the digital photolithography system for a micro-optic device on an optical fiber end surface, the ultraviolet LED, the red LED, and the green LED are distributed on a rotatable LED support at a same interval, and a distribution interval angle between the ultraviolet LED, the red LED, and the green LED is 120°.

Compared with the prior art, embodiments of the present invention may provide the following beneficial effects:

Distribution of an exposure dose jointly modulated by a digital mask combination formed by the primary and secondary DMD exceeds an order of modulation of an exposure dose by a single DMD. This can better respond to a large curvature structure in a FOD, to implement elaborate digital photolithography of the FOD. Compared with a conventional high energy beam point-by-point processing method, the digital photolithography method based on a DMD combination is a processing method for a FOD with a short cycle, low costs, and high precision.

BRIEF DESCRIPTION OF DRAWINGS

FIG. 1 is a step flowchart of a digital photolithography method for a FOD based on a DMD combination according to the present invention;

DETAILED DESCRIPTION

The following clearly and completely describes the technical solutions in the embodiments of the present invention with reference to accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

FIG. 1 is a step flowchart of a digital photolithography method for a FOD based on a DMD combination according to one or more embodiments of the present invention.

As shown in FIG. 1, in the digital photolithography method for a FOD based on a DMD combination in this embodiment, reflected light modulated by two DMDs is allowed to be simultaneously projected onto a same position on an optical fiber end surface through one reduction projection lens, where there is a one-to-one correspondence between spatial positions, on the optical fiber end surface, of various pixels of patterns modulated by the two DMDs; the two DMDs respectively generate a primary and secondary digital mask; the primary digital mask is used to form a small curvature structure through exposure; the secondary digital mask is specifically used for optimized fabrication of a large curvature structure through exposure; and the DMDs corresponding to the primary and secondary digital mask have identical structures, and no primary or secondary DMD is defined. Three light-emitting diode (LED) light sources are configured for each DMD, where the three LED light sources are an ultraviolet LED, a red LED, and a green LED, and can be successively rotated into an optical path according to a requirement to provide light sources for corresponding DMDs. Focusing is conducted before exposure fabrication, where during focusing, the DMD corresponding to the primary digital mask is matched with the red LED light source, and the DMD corresponding to the secondary digital mask is matched with the green LED light source; and patterns formed on the optical fiber end surface is monitored in real time by using a microscope, to guide a control system to adjust a position of the optical fiber. During exposure fabrication, patterns of the primary and secondary digital masks are shrunk, and shrunk patterns are allowed to be projected onto the optical fiber end surface coated with photoresist for exposure, where the photoresist includes positive photoresist or negative photoresist that can be used for photolithography fabrication; and developing, fixing, postbaking, and other processes are conducted to finally form a microstructure on the photoresist on the optical fiber end surface. Then, wet etching is conducted on the microstructure to form a microstructure device on the optical fiber end surface, where the wet etching can be replaced by dry etching in some embodiments.

Figure 2:
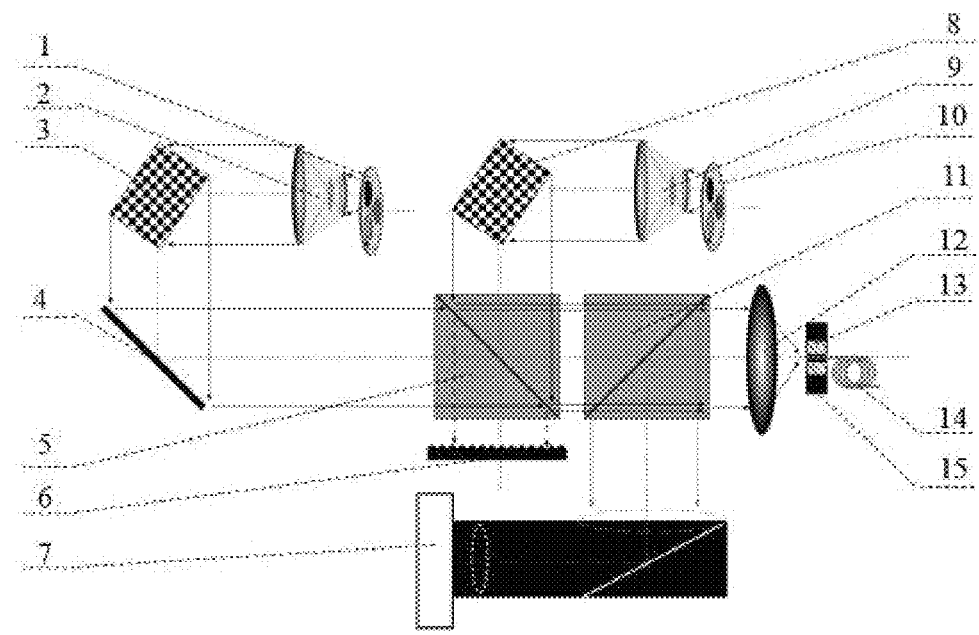
FIG. 2 is a schematic diagram of a digital photolithography system for a micro-optic device on an optical fiber end surface according to an embodiment of the present invention, where in this figure: 1. first LED light source; 2. first collimating lens; 3. first DMD; 4. total reflection mirror; 5. first beam splitter; 6. attenuator; 7. microscope; 8. second DMD; 9. second collimating lens; 10. second LED light source; 11. second beam splitter; 12. reduction projection lens; 13. optical fiber support; 14. optical fiber; and 15. three-dimensional displacement platform.
Figure 3:
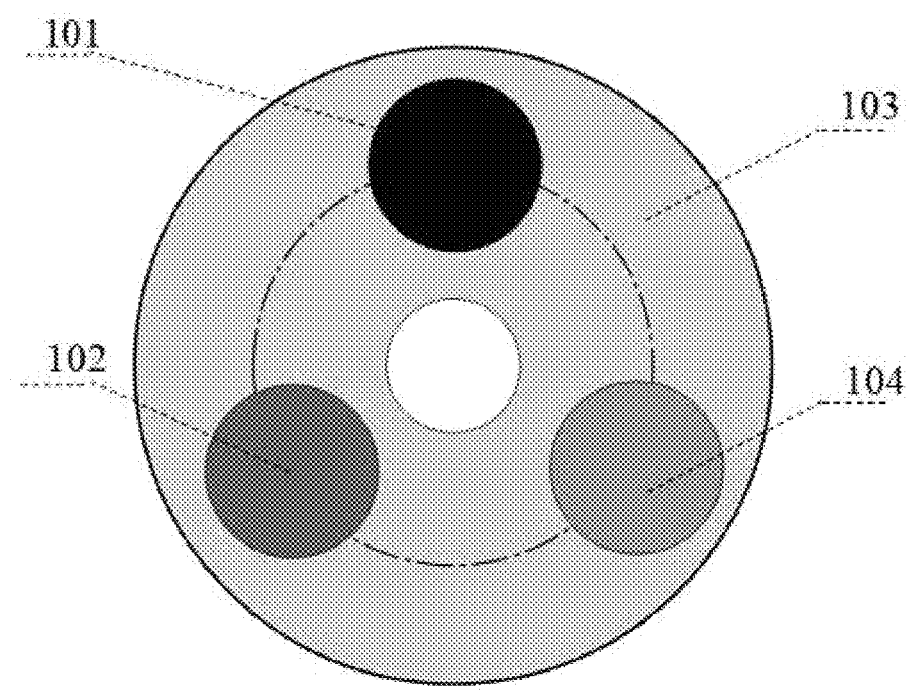
FIG. 3 is a partial schematic diagram of LED light sources in a digital photolithography system for a micro-optic device on an optical fiber end surface according to an embodiment of the present invention, where in this figure: 101. ultraviolet LED; 102. red LED; 103. LED support; and 104. green LED.

FIG. 2 is a schematic diagram of a digital photolithography system for a micro-optic device on an optical fiber end surface according to an embodiment of the present invention. FIG. 3 is a partial schematic diagram of LED light sources in a digital photolithography system for a micro-optic device on an optical fiber end surface according to an embodiment of the present invention.

As shown in FIG. 2, this embodiment provides the description by using an example in which a first DMD 3 generates a primary digital mask and a second DMD 8 generates a secondary digital mask.

Light emitted by a first LED light source 1 irradiates the first DMD 3 after being collimated by a first collimating lens 2; and light modulated by the first DMD 3 is reflected by a total reflection mirror 4 to a first beam splitter 5, and is shrunk to an end surface of an optical fiber 14 by a reduction projection lens 12 after passing through the first beam splitter 5 and a second beam splitter 11. Meanwhile, light emitted by a second LED light source 10 irradiates the second DMD 8 after being collimated by a second collimating lens 9; and light modulated by the second DMD 8 is directly incident to the first beam splitter 5, and is shrunk to the end surface of the optical fiber 14 by the reduction projection lens 12 after passing through the first beam splitter 5 and the second beam splitter 11. Patterns modulated by the two DMDs are reflected on the end surface of the optical fiber 14, amplified by the reduction projection lens 12, and then reflected into a microscope 7 by the second beam splitter 11. Then, exposure patterns on the end surface of the optical fiber 14 can be monitored in real time by a display terminal of the microscope 7.

Focusing is conducted before exposure fabrication, in one or more embodiments. First, the optical fiber 14 coated with photoresist is clamped on an optical fiber support 13 and then the optical fiber support 13 is fastened to a three-dimensional displacement platform 15. Digital mask patterns for focusing are respectively input by the first DMD 3 and the second DMD 8. The first LED light source 1 is switched to a red LED 102, and the second LED light source 10 is switched to a green LED 104. The three-dimensional displacement platform 15 is adjusted according to the patterns monitored by the microscope 7.

When the focusing ends and exposure fabrication is started, both the first LED light source 1 and the second LED light source 10 are switched to an ultraviolet LED 101. A controller respectively inputs pre-calculated digital mask patterns to the first DMD 3 and the second DMD 8, and then exposure is conducted on the FOD by controlling the exposure time of the first LED light source 1 and the second LED light source 10.

After the exposure ends, developing, fixing, postbaking, and other processes are conducted to finally form a microstructure on the photoresist on the end surface of the optical fiber 14. After wet etching is conducted on the microstructure, a microstructure device can be formed on the optical fiber 14. Light that is not used for exposure is absorbed by an attenuator 6 at a lower end of the first beam splitter 5, to avoid the impact on monitoring by the microscope 7.

FIG. 3 is a schematic structural diagram of LED light sources shown in FIG. 2. The first LED light source and the second LED light source are of a same structure. The ultraviolet LED 101, the red LED 102, and the green LED 104 are distributed on an LED support 103 at a same interval. The LED support 103 needs to be rotated by 120° when a light source needs to be replaced in the system.

It should be noted that, in this specification, relationship terms such as first and second are only used to distinguish an entity or operation from another entity or operation, but do not necessarily require or imply that there is any actual relationship or order between these entities or operations. In addition, terms "include", "comprise", or any other variations thereof are intended to cover non-exclusive including, so that a process, a method, an article, or a device including a series of elements not only includes those elements, but also includes other elements that are not explicitly listed, or also includes inherent elements of the process, the method, the article, or the device.

Although the embodiments of the present invention have been illustrated and described, it should be understood that persons of ordinary skill in the art may make various changes, modifications, replacements and variations to the above embodiments without departing from the principle and spirit of the present invention, and the scope of the present invention is limited by the appended claims and their equivalents.

What is claimed is:

1. A digital photolithography method for a fiber optic device (FOD) based on a digital micromirror device (DMD) combination, the method comprising:
    (i) allowing reflected light modulated by two DMDs to be simultaneously projected onto a same position on an optical fiber end surface through one reduction projection lens, where the two DMDs respectively generate a primary and secondary digital mask;
    (ii) configuring three light-emitting diode (LED) light sources for each DMD, where the three LED light sources are an ultraviolet LED, a red LED, and a green LED, and can be successively rotated into an optical path according to a requirement to provide light sources for corresponding DMDs;
    (iii) conducting focusing before exposure fabrication, wherein during focusing, the DMD corresponding to the primary digital mask is matched with the red LED light source; the DMD corresponding to the secondary digital mask is matched with the green LED light source; and monitoring patterns formed on the optical fiber end surface in real time by using a microscope, to guide a control system to adjust a position of the optical fiber;
    (iv) shrinking patterns of the primary and secondary digital masks, and allowing shrunk patterns to be projected onto the optical fiber end surface coated with photoresist for exposure; and conducting at least one of developing, fixing, and postbaking processes to finally form a microstructure on the photoresist on the optical fiber end surface; and
    (v) conducting wet etching on the microstructure obtained in step (iv) to form a microstructure device on the optical fiber end surface.

2. The digital photolithography method for a FOD based on a DMD combination according to claim 1, wherein the primary digital mask is used to form a small curvature structure through exposure, and the secondary digital mask is specifically used for optimized fabrication of a large curvature structure through exposure.

3. The digital photolithography method for a FOD based on a DMD combination according to claim 2, wherein the DMDs corresponding to the primary and secondary digital masks have identical structures, and no primary or secondary DMD is defined.

4. The digital photolithography method for a FOD based on a DMD combination according to claim 3, wherein there is a one-to-one correspondence between spatial positions, on the optical fiber end surface, of various pixels of the patterns modulated by the two DMDs.

5. The digital photolithography method for a FOD based on a DMD combination according to claim 1, wherein the photoresist comprises positive photoresist or negative photoresist that can be used for photolithography fabrication.

6. The digital photolithography method for a FOD based on a DMD combination according to claim 1, wherein the wet etching in step (v) is replaced by dry etching.

7. A digital photolithography system for a micro-optic device on an optical fiber end surface, applied to the digital photolithography method for a FOD based on a DMD combination according to claim 1, the system comprising:
    an optical fiber and an optical fiber support for holding the optical fiber;
    a first light-emitting diode (LED) light source and a second LED light source for emitting light;
    a first DMD and a second DMD for modulating light;
    a first collimating lens and a second collimating lens for collimating light beams;
    a total reflection mirror for reflecting light;
    a first beam splitter and a second beam splitter for splitting light into two light beams;
    a reduction projection lens for projecting a pattern;
    a microscope for monitoring an exposure pattern on an optical fiber end surface in real time; and
    an attenuator for absorbing light that is not used for exposure.

8. The digital photolithography system for a micro-optic device on an optical fiber end surface according to claim 7, wherein the optical fiber support is fastened to a three-dimensional displacement platform.

9. The digital photolithography system for a micro-optic device on an optical fiber end surface according to claim 7, wherein the first LED light source and the second LED light source are of a same structure, and both comprise an ultraviolet LED, a red LED, and a green LED.

10. The digital photolithography system for a micro-optic device on an optical fiber end surface according to claim 9, wherein the ultraviolet LED, the red LED, and the green LED are distributed on a rotatable LED support at a same interval and a distribution interval angle between the ultraviolet LED, the red LED, and the green LED is 120°.

\* \* \* \* \*